(12) United States Patent
Wu et al.

(10) Patent No.: US 11,852,673 B1
(45) Date of Patent: Dec. 26, 2023

(54) METHOD FOR GENERATING CHIP PROBING WAFER MAP

(71) Applicant: Powerchip Semiconductor Manufacturing Corporation, Hsinchu (TW)

(72) Inventors: Ying-Ju Wu, Hsinchu County (TW); Ching-Ly Yueh, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/904,000

(22) Filed: Sep. 6, 2022

(30) Foreign Application Priority Data

Jul. 22, 2022 (TW) ................................. 111127496

(51) Int. Cl.
 *G01R 31/28* (2006.01)
 *G06T 11/00* (2006.01)
(52) U.S. Cl.
 CPC ........ *G01R 31/2831* (2013.01); *G06T 11/001* (2013.01)
(58) Field of Classification Search
 CPC ... G01R 31/2831; G06T 11/001; G06T 7/001; G06T 2207/30; G01F 19/00; G01N 31/00; G01N 21/00; G01N 21/8851; G01N 21/9501; G01N 21/956; G01N 2021/8854; G01N 2021/8887; H01L 21/66; G06F 11/079

USPC .................................................... 324/759.01
See application file for complete search history.

(56) References Cited

U.S. PATENT DOCUMENTS 5,838,951 A 11/1998 Song
2006/0031801 A1 2/2006 McIntyre et al.

FOREIGN PATENT DOCUMENTS

KR 20190020994 A * 3/2019 ............. H01L 22/24
TW 201120466 6/2011
TW M560664 5/2018

OTHER PUBLICATIONS

Espacenet translation KR20190020994A (Year: 2019).*
"Office Action of Taiwan Counterpart Application", dated May 3, 2023, p. 1-p. 5.

* cited by examiner

*Primary Examiner* — Jermele M Hollington
*Assistant Examiner* — Courtney G McDonnough
(74) *Attorney, Agent, or Firm* — JCIPRNET

(57) ABSTRACT

Provided is a method for generating a chip probing wafer map, and the method includes: obtaining test data associated with a first chip, wherein the first chip includes a plurality of sequentially arranged first dies, and each of the first dies belongs to one of a plurality of bin numbers; assigning different predetermined color codes to the bin numbers; and generating a first general chip probing wafer map for the first chip by assigning a color code of each of the first dies as a corresponding predetermined color code according to the bin number to which each of the first dies belongs.

4 Claims, 7 Drawing Sheets

METHOD FOR GENERATING CHIP PROBING WAFER MAP

CROSS-REFERENCE TO RELATED APPLICATION

This application claims the priority benefit of Taiwan application serial no. 111127496, filed on Jul. 22, 2022. The entirety of the above-mentioned patent application is hereby incorporated by reference herein and made a part of this specification.

BACKGROUND

Technical Field

The present disclosure relates to a method for generating wafer test information, and particularly relates to a method for generating a chip probing wafer map.

Description of Related Art

The chip probing wafer map (referred to as CP map) of a specified wafer is reviewed by Engineers for different purposes. Common CP maps include a single map, a composite map, a bin-grouping map, etc.

In a single map corresponding to a certain wafer, dies belonging to a certain specified bin number is presented by a color specified by the user. And in a bin-grouping map corresponding to a certain wafer, dies belonging to different bin numbers may be presented by different colors.

Also, different wafers may have corresponding single maps according to the same specified bin number, and the single maps of different wafers may be superimposed to form a composite map.

Since different products have different definitions on bin colors, it is common to generate the CP maps in advance according to demands before storing them in a database.

Specifically speaking, when implementing the above process, the user needs to set the bin colors as needed at the system interface to draw the CP map, and then generate the CP map through scheduling. If the user sets parameters of multiple groups of bin-grouping maps at the same time, the corresponding bin-grouping map of each group need to be stored in a server/database, thus occupying a large amount of storage space.

In addition, if the CP map is drawn using the above scheduling technique, when the user wants to change the bin color, the system needs to redraw all the CP maps stored in the server/database. Furthermore, to generate a new single and/or composite map, the CP maps must be redrawn, as the system cannot generate the CP maps by processing the existing CP maps.

Although there is the approach to draw CP maps in real time in the prior art, it still takes a longer time to obtain the CP maps. In this approach, the CP original data in the database is accessed by the system in real time to draw the CP map accordingly. However, if the user wants to view a large amount of CP maps all at once, the system needs to devote a large amount of its resources to accessing the original CP data in the database, thereby greatly prolonging the waiting time of the user.

SUMMARY

The disclosure is directed to a method for generating a chip probing wafer map, which is adapted to resolve the aforementioned technical problems.

The disclosure provides a method for generating a chip probing wafer map including: obtaining test data associated with a first wafer, wherein the first wafer includes a plurality of sequentially arranged first dies, and each of the first dies belongs to one of a plurality of bin numbers; assigning different predetermined color codes to the bin numbers; and generating a general chip probing wafer map for the first wafer by assigning a color code of each of the first dies as a corresponding predetermined color code according to a bin number to which each of the first dies belongs.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
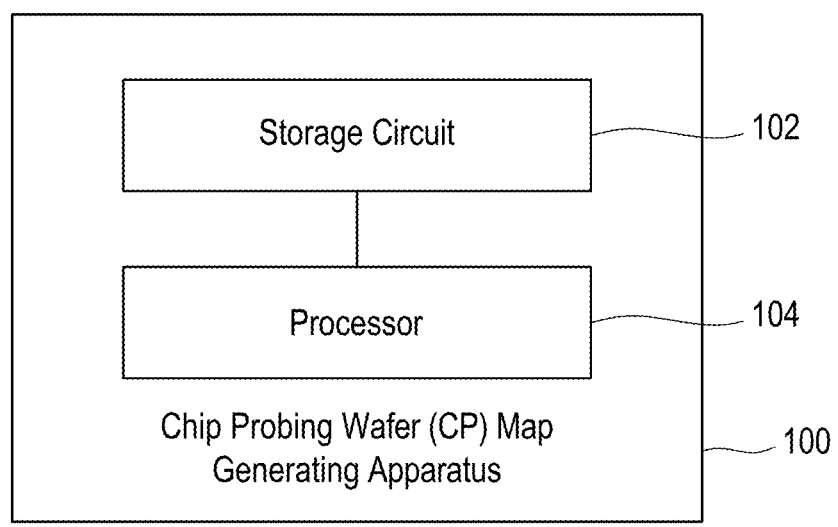
FIG. 1 is a schematic diagram of a chip probing wafer (CP) map generating apparatus according to an embodiment of the disclosure.

FIG. 1 is a schematic diagram of a chip probing wafer (CP) map generating apparatus according to an embodiment of the disclosure. In different embodiments, a CP map generating apparatus 100 may be implemented as various smart devices and/or computer devices, but the disclosure is not limited thereto.

In FIG. 1, the CP map generating apparatus 100 includes a storage circuit 102 and a processor 104. The storage circuit 102 is, for example, any type of fixed or removable random access memory (RAM), a read-only memory (ROM), a flash memory, a hard drive or other similar devices or a combination of these devices, which may be used to record a plurality of program codes or modules.

The processor 104 is coupled to the storage circuit 102, and may be a general-purpose processor, a special-purpose processor, a conventional processor, a digital signal processor, a plurality of microprocessors, one or a plurality of microprocessors, controllers, microcontrollers, application specific integrated circuits (ASICs), field programmable gate arrays (FPGAs) combined with digital signal processor cores, any other type of integrated circuit, state machine, advanced RISC machine (ARM) based processor, and similar products.

In an embodiment of the disclosure, the processor 104 may access the modules and program codes recorded in the storage circuit 102 to implement the method for generating a CP map proposed by the disclosure, and the details thereof are described below.

Figure 2:
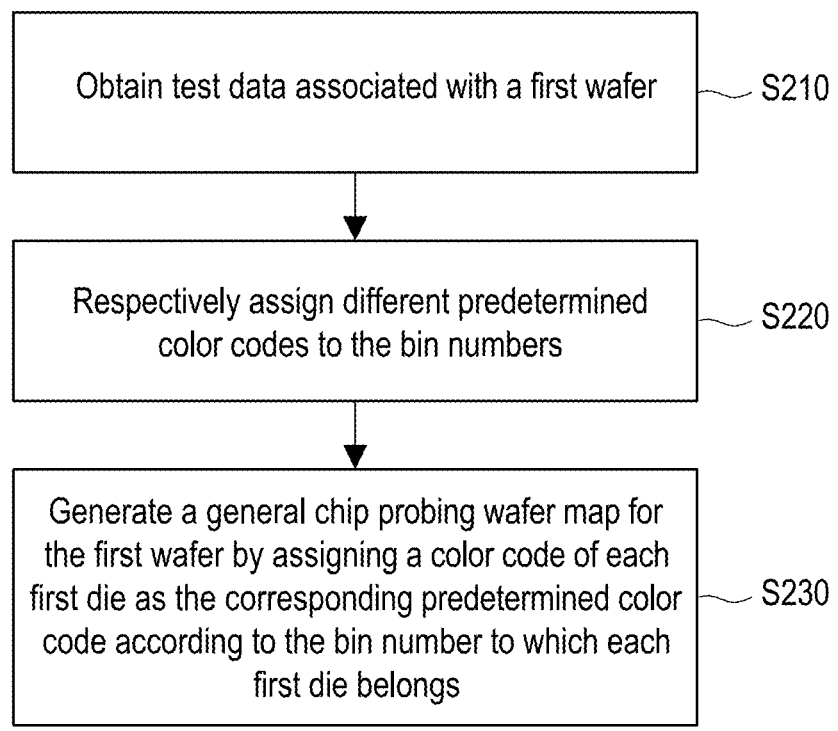
FIG. 2 is a flowchart of a method for generating a CP map according to an embodiment of the disclosure.

FIG. 2 is a flowchart of a method for generating a CP map according to an embodiment of the disclosure. The method of the embodiment may be performed by the CP map generating apparatus 100 in FIG. 1. Details of each step in FIG. 2 are described below with reference of the components shown in FIG. 1.

In step S210, the processor 104 obtains test data associated with a first wafer. In an embodiment of the disclosure, the first wafer is, for example, any wafer for which a CP map is to be generated, and the first wafer may include, for example, a plurality of dies (referred to as first dies hereinafter) arranged in sequence.

In an embodiment, the test data of the first wafer may indicate a bin number corresponding to each first die. For example, the first dies of a certain portion may correspond to a bin number 1 (represented by Bin1), and the first dies of another portion may correspond to a bin number 3 (represented by Bin3), and so on.

In an embodiment of the disclosure, each first die belongs to one of a plurality of bin numbers. For example, it is assumed that there are K considered bin numbers in total (represented by Bin1 to BinK, where K is a positive integer), any first die belongs to one of Bin1 to BinK, but the disclosure is not limited thereto.

In step S220, the processor 104 respectively assigns a plurality of different predetermined color codes to the bin numbers.

In an embodiment, the processor 104 may arbitrarily assign different predetermined color codes to each bin number according to needs of a designer. For example, if there are K considered bin numbers in total, the processor 104 may arbitrarily assign K different predetermined color codes to the K bin numbers, respectively.

In an embodiment, the processor 104 may also determine the predetermined color code corresponding to each bin number according to a specific principle. For the convenience of description, it is assumed that K is 256, but the embodiments of the disclosure may not be limited thereto. In this case, for an X-th bin number (represented by BinX) among the K bin numbers, the processor 104 may determine the corresponding predetermined color code thereof base on "BinX: $f(\#RRGGBB)=(256^2 \times int(BB)+256 \times int(GG)+int(RR))-1$".

In this case, the predetermined color codes respectively corresponding to the 256 bin numbers may be exemplified in the following table 1.

TABLE 1

| nR  | nG | nB | predetermined color code | X   |
|-----|----|----|--------------------------|-----|
| 1   | 0  | 0  | #010000                  | 1   |
| 2   | 0  | 0  | #020000                  | 2   |
| ... |    |    |                          |     |
| 255 | 0  | 0  | #FF0000                  | 255 |
| 0   | 1  | 0  | #000100                  | 256 |
| ... |    |    |                          |     |

In Table 1, the predetermined color code of Bin1 is, for example, "#010000"; the predetermined color code of Bin2 is, for example, "#020000"; the predetermined color code of Bin255 is, for example, "#FF0000"; and the color code of Bin256 is, for example, "#000100". For the convenience of description, it is assumed that the processor 104 determines/assigns the predetermined color code corresponding to each bin number based on the content of Table 1, but this is only for example, and is not intended to limit possible implementations of the disclosure.

In step S230, the processor 104 assigns a color code of each first die as a corresponding predetermined color code according to the bin number to which each first die belongs, so as to generate a general CP map of the first wafer.

For example, if a certain first die A belongs to Bin1, the processor 104 may assign the color code of the first die A as the predetermined color code corresponding to Bin1, such as #010000 in Table 1. If a certain first die B belongs to Bin2, the processor 104 may assign the color code of the first die B as the predetermined color code corresponding to Bin2, such as #020000 in Table 1. If a certain first die C belongs to Bin255, the processor 104 may assign the color code of the first die C as the predetermined color code corresponding to Bin255, such as #FF0000 in Table 1. If a certain first die D belongs to Bin256, the processor 104 may assign the color code of the first die D as the predetermined color code corresponding to Bin256, such as #000100 in Table 1.

In this way, a general CP map of the first wafer may be generated accordingly. In the general CP map of the first wafer (a file format thereof is, for example, JPG, PNF or other common image file formats), a color of each pixel in an image region is presented according to the color code of the corresponding first die.

For example, a color of a pixel A in the image region corresponding to the first die A (which belongs to Bin1) may be, for example, represented as a color of the color code #010000. A color of the pixel B in the image region corresponding to the first die B (which belongs to Bin2) may be, for example, represented as a color of the color code #020000. A color of the pixel C in the image region corresponding to the first die C (which belongs to Bin255) may be, for example, represented as a color of the color code #FF0000. A color of the pixel located in the image region corresponding to the first die D (which belongs to Bin256) may be, for example, represented as a color of the color code #000100.

It should be understood that although pixels corresponding to different bin numbers (of the first die) are presented in different colors in the general CP map of the first wafer, in the situation shown in Table 1, since the predetermined color codes corresponding to different bin numbers are not very different, the general CP map of the first wafer generated based on Table 1 may probably present an almost completely black pattern to human eyes.

In other embodiments, if the predetermined color codes corresponding to different bin numbers are designed to have relatively large differences, the human eyes may also distinguish a color difference between pixels corresponding to different bin numbers (of the first die) in the generated general CP map of the first wafer, but the disclosure is not limited thereto.

In the embodiment of the disclosure, after generating the general CP map of the first wafer, the processor 104 may store it in a server/database. Since the general CP map of the first wafer may be simply stored in the server/database in a common image file format (for example, JPG), it occupies less storage space compared to the conventional technique. Moreover, since the process of generating the general CP map of the first wafer is relatively simple, it may also be completed under a situation of consuming less computing resources.

In an embodiment, when the user wants to obtain a single map, a composite map, and/or a bin-grouping map associated with the first wafer, the processor 104 only needs to perform simple processing on the general CP map of the first wafer to generate the CP map required by the user. The following description is made with reference of different embodiments.

Figure 3:
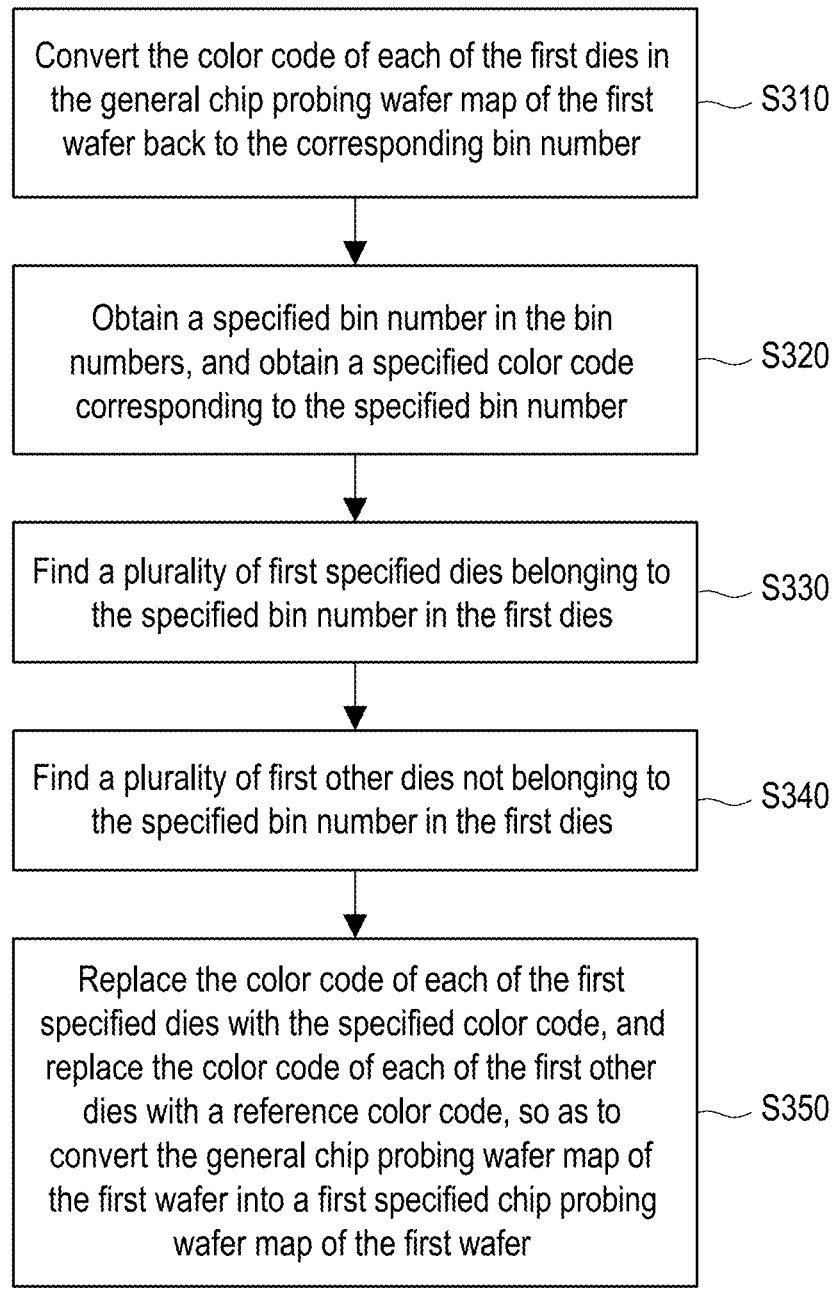
FIG. 3 is a flowchart of generating a specified CP map according to an embodiment of the disclosure.

FIG. 3 is a flowchart of generating a specified CP map according to an embodiment of the disclosure. In a first embodiment, it is assumed that the user wants to obtain a single map of the first wafer for a certain bin number, the processor 104 may correspondingly execute steps S310 to S350 to generate a corresponding single map to serve as a first specified CP map of the first wafer.

Figure 4:
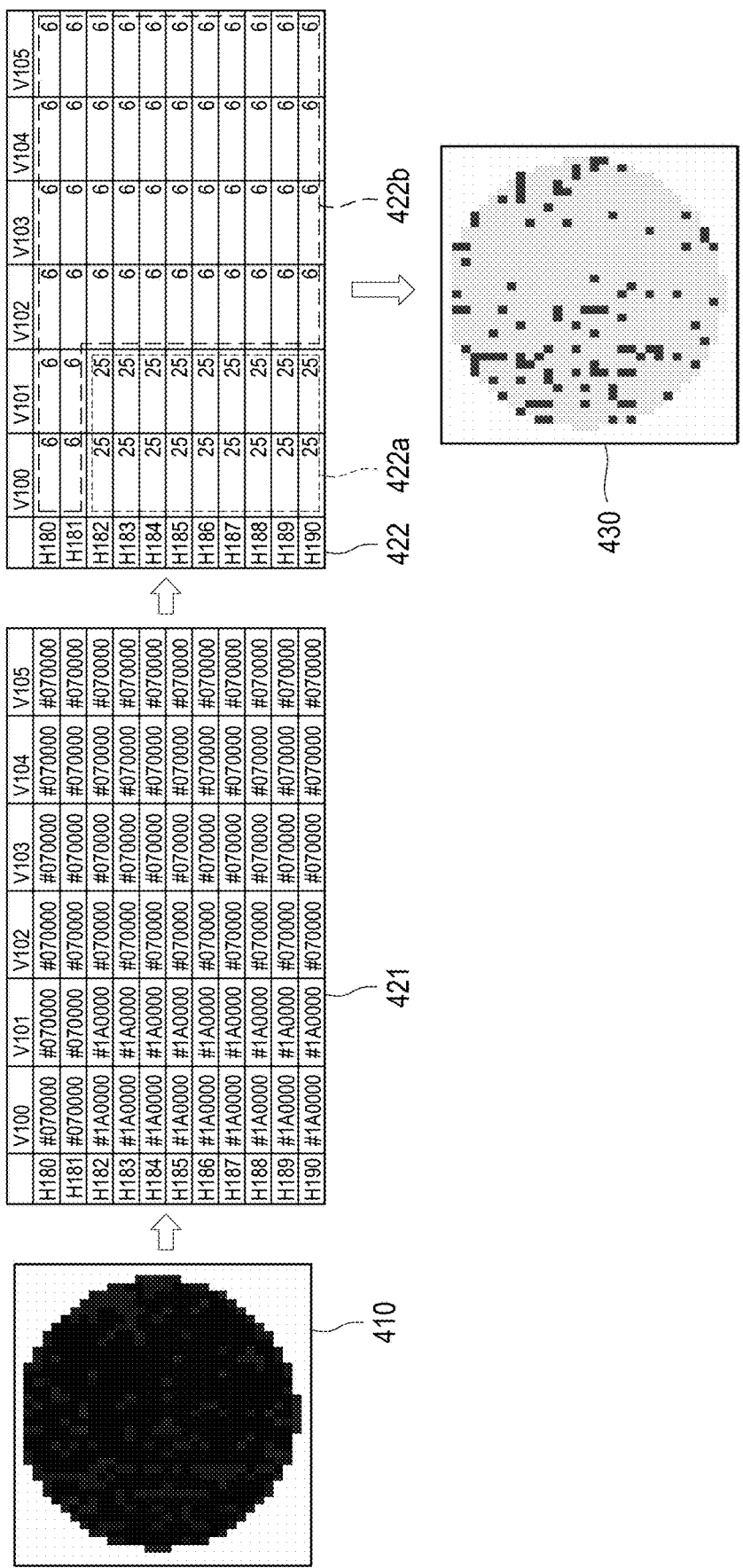
FIG. 4 is an application situational diagram according to a first embodiment of the disclosure.

Moreover, in order to make the concept of FIG. 3 easier to understand, the following description is made with reference of FIG. 4, and FIG. 4 is an application situational diagram according to a first embodiment of the disclosure.

Specifically, in step S310, the processor 104 converts the color code of each first die in the general CP map of the first wafer back to the corresponding bin number.

For example, the processor 104 may convert the color code (for example, #010000) of the first die A corresponding to the pixel A into the bin number Bin1 according to Table 1. In addition, the processor 104 may convert the color code (for example, #020000) of the first die B corresponding to the pixel B into the bin number Bin2 according to Table 1. Moreover, the processor 104 may convert the color code (for example, #FF0000) of the first die C corresponding to the pixel C into the bin number Bin255 according to Table 1. Furthermore, the processor 104 may convert the color code (for example, #000100) of the first die D corresponding to the pixel D into the bin number Bin256 according to Table 1.

In the situation of FIG. 4, it is assumed that the general CP map of the first wafer under consideration is a general CP map 410, the processor 104 may accordingly obtain the content as shown in a first data structure 421. In FIG. 4, the shown first data structure 421 only exemplarily corresponds to a part of the general CP map 410.

In the first data structure 421, a horizontal axis (for example, V100 to V105) corresponds to vertical coordinates in the general CP map 410, and a vertical axis (for example, H180 to H190) corresponds to horizontal coordinates in the general CP map 410. In the first data structure 421, (Hx, Vy) represents a pixel at coordinates (x, y) in the general CP map 410, and corresponds to each first die. A color code of (Hx, Vy) is, for example, obtained through conversion of a pixel color of the coordinates (x, y) in the general CP map 410.

For example, the color code (i.e., #070000) of (H180, V100) is, for example, obtained through conversion of the pixel color of the coordinates (180, 100) in the general CP map 410. The color code (i.e., #1A0000) of (H182, V101) is, for example, obtained through conversion of the pixel color of the coordinates (182, 101) in the general CP map 410. The color code (i.e., #070000) of (H186, V103) is, for example, obtained through conversion of the pixel color of the coordinates (186, 103) in the general CP map 410. As determination schemes of the color codes of the remaining positions in the first data structure 421 may be deduced according to the above description, the same is not repeated herein.

Thereafter, the processor 104 may convert the color codes in the first data structure 421 into corresponding bin numbers to generate a second data structure 422. In the first embodiment, it is assumed that the color codes #070000 and #1A0000 respectively correspond to Bin6 and Bin25, the processor 104 may respectively convert #070000 and #1A0000 in the first data structure 421 to 6 and 25, thereby generating the second data structure 422.

Then, in step S320, the processor 104 obtains the specified bin number among the bin numbers, and obtains a specified color code corresponding to the specified bin number.

In the first embodiment, it is assumed that the user wants to obtain the single map of the first wafer for Bin1, and wants to mark the first die belonging to Bin1 with a specified color (for example, dark brown) in the single map, the processor 104 may regard Bin1 as the above-mentioned specified bin number, and obtain the color code corresponding to the specified color to serve as the specified color code.

In another embodiment, it is assumed that the user wants to obtain the single map of the first wafer for Bin256, and wants to mark the first die belonging to Bin256 with a specified color (for example, dark brown) in the single map, the processor 104 may regard Bin256 as the above-mentioned specified bin number, and obtain the color code corresponding to the specified color to serve as the specified color code, but the disclosure is not limited thereto.

In step S330, the processor 104 finds a plurality of first specified dies belonging to the specified bin number in the first dies. Moreover, in step S340, the processor 104 finds a plurality of first other dies not belonging to the specified bin number in the first die.

For example, if the considered specified bin number is Bin0, the processor 104 may find the dies belonging to Bin0 in the first dies to serve as the first specified dies, and regard all of the dies not belonging to Bin0 as the first other dies. For another example, if the considered specified bin number is Bin256, the processor 104 may find the dies belonging to Bin256 in the first dies to serve as the first specified dies, and regard all of the dies not belonging to Bin256 as the first other dies, but the disclosure is not limited thereto.

In an embodiment, the processor 104 may determine the first specified dies by finding the pixel corresponding to the specified bin number in the second data structure 420. For example, it is assumed that only a region 422a in the second data structure 422 corresponds to Bin25, and only a region 422b corresponds to Bin6.

In this case, if the considered specified bin number is Bin25, the processor 104 may regard the dies to which the pixels corresponding to the region 422a belong as the first specified dies, and regard all of the dies to which the pixels corresponding to other regions (such as the region 422b) belong as the first other dies. For another example, if the considered specified bin number is Bin6, the processor 104 may regard the dies to which the pixels corresponding to the region 422b belong as the first specified dies, and regard all of the dies to which the pixels corresponding to other regions (such as the region 422a) belong as the first other dies, but the disclosure is not limited thereto.

Thereafter, in step S350, the processor 104 replaces the color code of each first specified die with the specified color code, and replaces the color code of each first other die with a reference color code, so that the general CP map of the first wafer is converted to a first specified CP map 430 of the first wafer.

In an embodiment, it is assumed that the considered specified bin number is Bin25, the specified color code is the color code corresponding to dark brown, and the reference color code is the color code corresponding to light brown. In this way, the processor 104 may, for example, set the color code of each pixel in the region 422a to the color code corresponding to dark brown, and set the color code of each pixel in other regions (for example, the region 422b) to the color code corresponding to light brown, so as to generate the corresponding first specified CP map 430.

In another embodiment, it is assumed that the considered specified bin number is Bin6, the specified color code is the color code corresponding to dark brown, and the reference color code is the color code corresponding to light brown. In this way, the processor 104 may, for example, set the color code of each pixel in the region 422b to the color code corresponding to dark brown, and set the color code of each pixel in other regions (for example, the region 422a) to the color code corresponding to light brown, so as to generate the corresponding first specified CP map 430.

In an embodiment of the disclosure, the first specified CP map 430 shown in FIG. 4 is only exemplarily shows possible a single map pattern, and is not intended to limit possible implementations of the disclosure.

As described above, the method of the embodiment of the disclosure may generate a corresponding single map according to the user's needs only through simple conversion. Accordingly, the efficiency of generating the single map may be improved without occupying too much storage space.

In a second embodiment, if the user wants to obtain a bin-grouping map of the first wafer for a plurality of bin numbers, the processor 104 may also perform steps S310 to S350 correspondingly to generate the corresponding bin-grouping map to serve as the first specified CP map of the first wafer.

To be specified, in the second embodiment, the processor 104 may first perform step S310 to convert the color code of each first die in the general CP map 410 of the first wafer back to the corresponding bin number. For details of step S310, reference may be made to the relevant descriptions in the first embodiment, and details thereof are not repeated.

Then, in step S320, the processor 104 obtains a specified bin number in the bin numbers, and obtains the specified color code corresponding to the specified bin number.

In the second embodiment, it is assumed that the user wants to obtain the bin-grouping map of the first chip for Bin25 and Bin6, and wants to mark the first dies belonging to Bin 25 and Bin 6 in the bin-grouping map by respectively using a first specified color (such as dark brown) and a second specified color (for example, blue). In this case, the processor 104 may respectively regard Bin25 and Bin6 as a first specified bin number and a second specified bin number, and obtain color codes respectively corresponding to the first specified color and the second specified color to serve as the first specified color code and the second specified color code.

In step S330, the processor 104 finds a plurality of first specified dies belonging to the specified bin number in the first dies. In step S340, the processor 104 finds a plurality of first other dies not belonging to the bin number in the first dies.

Based on the above description, the processor 104 may find the first dies belonging to Bin25 and Bin6 in the first dies to serve as the considered first specified dies, and take the first dies not belonging to Bin25 and Bin6 as the considered first other dies, but the disclosure is not limited thereto.

Thereafter, in step S350, the processor 104 replaces the color code of each first specified die with the specified color code, and replaces the color code of each first other die with the reference color code, so as to convert the general CP map 410 of the first wafer into the first specified CP map of the first wafer.

In the second embodiment, the processor 104 may replace the color code of each first specified die belonging to the first specified bin number with the first specified color code, and replace the color code of each first specified die belonging to the second specified bin number with the second specified color code, where the first specified color code, the second specified color code, and the reference color code are all different from one another.

Based on the above description, the processor 104 may, for example, replace the color code of the first specified die belonging to Bin25 with the first specified color code (for example, the color code corresponding to dark brown), and replace the color code of the first specified die belonging to Bin6 with the second specified color code (for example, the color code corresponding to blue). Moreover, the processor 104 may replace the color code of each first other die with a reference color code (for example, a color code corresponding to light brown). Based on the above description, the processor 104 may correspondingly convert the general CP map 410 of the first wafer into a first specified CP map of the first wafer, where the first specified CP map is, for example, a bin-grouping map that marks the first dies corresponding to Bin25 with dark brown, marks the first dies corresponding to Bin6 with blue, and marks the first dies not belonging to Bin25 and Bin6 with light brown, but the disclosure is not limited thereto.

In other embodiments, the user may specify more bin numbers as the considered specified bin numbers, and the processor 104 may generate the corresponding bin-grouping map based on the mechanism described in the second embodiment.

Figure 5:
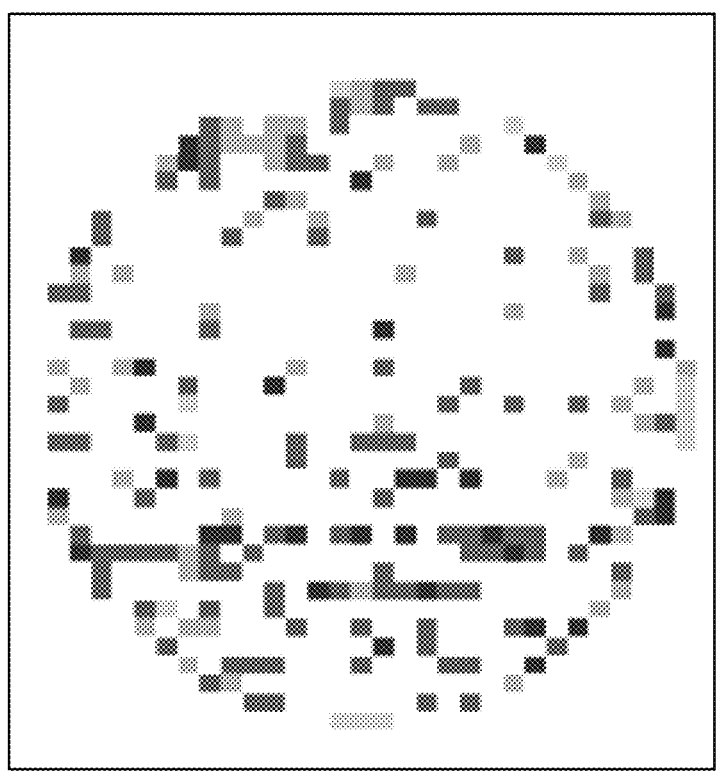
FIG. 5 is a bin-grouping map according to a second embodiment of the disclosure.

FIG. 5 is a bin-grouping map according to a second embodiment of the disclosure. In the situation of FIG. 5, it is assumed that the user specifies several bin numbers as the considered specified bin numbers, and sets a corresponding specified color code for each specified bin number, the processor 104 may, for example, generate a corresponding bin-grouping map 500 for user's reference. In the bin-grouping map 500, the first dies corresponding to a certain specified bin number are marked with a corresponding specified color. In this way, the user may observe a distribution of the first dies belonging to different specified bin numbers.

Based on the above description, it is known that the method according to the embodiment of the disclosure may generate the corresponding bin-grouping map according to the needs of the user through simple conversion. Accordingly, the efficiency of generating the bin-grouping map may be improved without occupying too much storage space.

Figure 6:
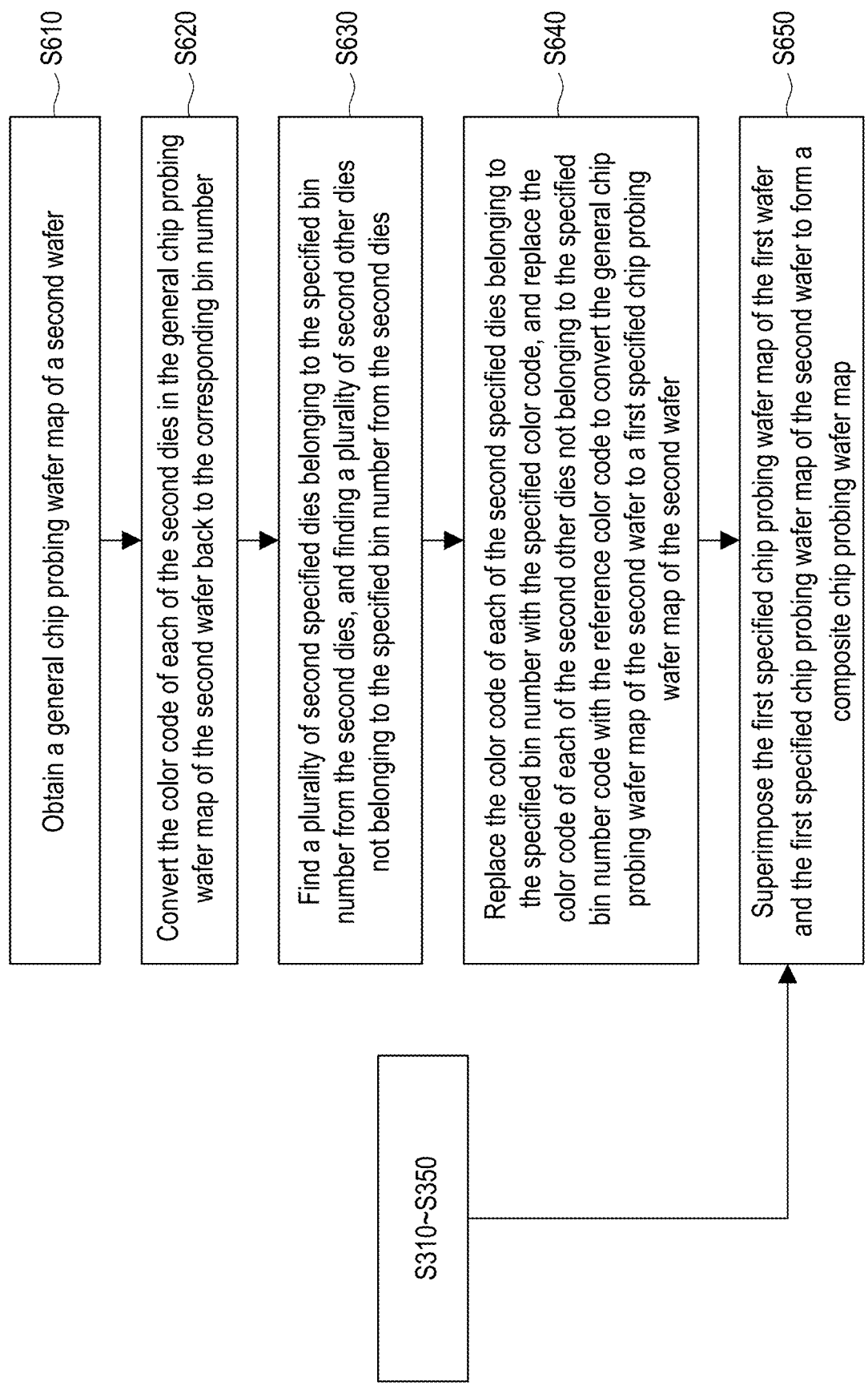
FIG. 6 is a flowchart of generating a composite map according to a third embodiment of the disclosure.

FIG. 6 is a flowchart of generating a composite map according to a third embodiment of the disclosure. In the third embodiment, it is assumed that the user wants to obtain a composite map of the first wafer and the second wafer for a specified bin number, the processor 104 may accordingly execute the method of FIG. 6.

In the third embodiment, the processor 104 may execute steps S310 to S350 based on the teachings of the first embodiment to obtain the first specified CP map of the first wafer. For related details thereof, reference may be made to the descriptions of the first embodiment, and the same is not repeated herein.

For the convenience of description, it is assumed that the considered specified bin number in the third embodiment is Bin25, but it is only used as an example, and is not used to limit possible implementations of the disclosure.

In this case, the first specified CP map of the first wafer may be understood as a single map corresponding to Bin25. In this single map, the first dies corresponding to Bin25 are marked with a specified color, and the other first dies not corresponding to Bin25 are marked with a reference color. For the convenience of description, it is assumed that the specified color and the reference color used in the third embodiment are respectively dark brown and light brown, but the disclosure is not limited thereto. In this case, in the first specified CP map of the first wafer, the first dies corresponding to Bin25 are marked with dark brown, and the other first dies not corresponding to Bin25 are marked with light brown.

In addition, in the third embodiment, the processor 104 may further execute steps S610 to S650 to obtain the first specified CP map of the second wafer.

To be specific, in step S610, the processor 104 may obtain the general CP map of the second wafer. In the third embodiment, the processor 104 may generate the general CP map of the second wafer in advance based on the method of generating the general CP map of the first wafer (i.e., the method shown in FIG. 2), and store it in a server/database.

For example, the processor 104 may first obtain the test data associated with the second wafer (corresponding to step S210), where the second wafer is, for example, any wafer for which a CP map is to be generated, and the second wafer may include, for example, a plurality of dies (referred to as second dies hereinafter) arranged in sequence.

In an embodiment, the test data of the second wafer may indicate a bin number corresponding to each second die. For example, a portion of the second dies may correspond to a bin number 1 (represented by Bin1), another portion of the second dies may correspond to a bin number 3 (represented by Bin3), and so on.

Then, the processor 104 may assign the color code of each second die as the corresponding predetermined color code according to the bin number to which each second die belongs, so as to generate the general CP map of the second wafer (corresponding to step S230). For related details, reference may be made to the description of the embodiment in FIG. 2, as the same is not repeated herein.

Thereafter, when the user wants to generate the CP map associated with the second wafer, the processor 104 may obtain the general CP map of the second wafer from the server/database in step S610, but the disclosure is not limited thereto.

In step S620, the processor 104 may convert the color code of each second die in the general CP map of the second wafer back to the corresponding bin number.

For example, the processor 104 may convert the color code of each second die into a corresponding bin number according to Table 1. In this case, the processor 104 may correspondingly obtain the bin number of each pixel in the image region corresponding to each second die.

Based on the above description, the processor 104 may generate another second data structure similar to the second data structure 422 in FIG. 4 for the second wafer.

In step S630, the processor 104 may find a plurality of second specified dies belonging to the specified bin number from the second dies, and find a plurality of second other dies not belonging to the specified bin number from the second dies Based on the above description, in the case where the specified bin number is assumed to be Bin25, the processor 104 may find the dies belonging to Bin25 from the second dies to serve as the second specified dies, and take the dies not belonging to Bin25 as the second other dies.

In an embodiment, the processor 104 may determine the second specified dies by finding pixels corresponding to the specified bin number in the second data structure corresponding to the second dies.

For the convenience of description, it is assumed that the second data structure corresponding to the second dies also has the aspects of the second data structure 422 in FIG. 4. In this case, if the considered specified bin number is Bin25, the processor 104 may take the dies to which the pixels corresponding to the region 422*a* belong as the second specified dies, and take the dies to which the pixels of other regions (for example, the region 422*b*) belong as second other dies.

Thereafter, in step S640, the processor 104 may replace the color code of each second specified die belonging to the specified bin number with the specified color code, and replace the color code of each second other die not belonging to the specified bin number with the reference color code, so as to convert the general CP map of the second wafer to the first specified CP map of the second wafer.

In the third embodiment, since the specified color and the reference color are respectively assumed to be dark brown and light brown, the specified color code may be a color code corresponding to dark brown, and the reference color code may be a color code corresponding to light brown. Therefore, the processor 104 may, for example, set the color code of each pixel in the region 422*a* corresponding to the second data structure of the second dies to the color code corresponding to dark brown, and set the color code of each pixel in other regions (for example, the region 422*b*) to the color code corresponding to light brown, so as to generate the first specified CP map of the second wafer.

In this case, the first specified CP map of the second wafer may be understood as a single map corresponding to Bin25. In the single map, the second dies corresponding to Bin25 are marked with a specified color, and the other second dies not corresponding to Bin25 are marked with a reference color. For example, in the first specified CP map of the second wafer, the second dies corresponding to Bin25 are marked as dark brown, and the other second dies not corresponding to Bin25 are marked with light brown, but the disclosure is not limited thereto.

Thereafter, in step S650, the processor 104 may superimpose the first specified CP map of the first wafer and the first specified CP map of the second wafer to form a composite map.

As that described above, the method of the embodiment of the disclosure only needs to first generate the single maps of different wafers according to the specified bin number (for example, Bin25) required by the user, and then superimpose the single maps of different wafers to form the desired composite map. Accordingly, the efficiency of generating the composite map may be improved without occupying too much storage space.

In other embodiments, in addition to superimposing the single maps of the first wafer and the second wafer into the composite map, the processor 104 may further generate a single map corresponding to a specified bin number (for example, Bin25) for other wafers according to user requirements, and superimpose the single map corresponding to each wafer to form a composite map. In the composite map, the user may observe a color change to observe which positions on these wafers the dies belonging to the specified bin number have a higher failure rate, but the disclosure is not limited to this.

Figure 7:
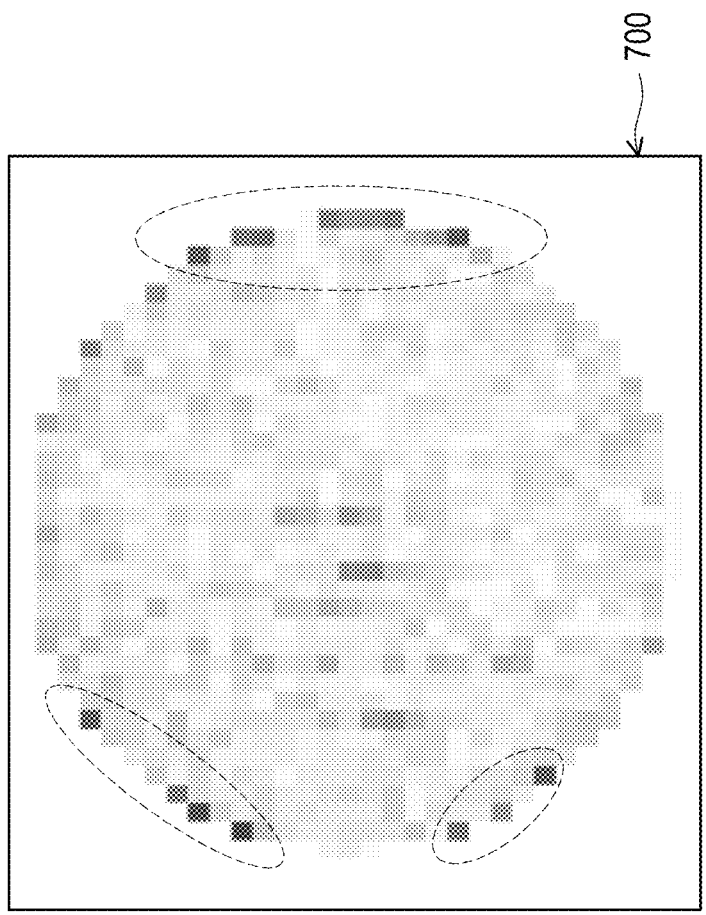
FIG. 7 is a schematic diagram of a composite map according to an embodiment of the disclosure.

FIG. 7 is a schematic diagram of a composite map according to an embodiment of the disclosure. In FIG. 7, the processor 104 may, for example, first generate corresponding single maps for multiple wafers based on the specified bin numbers, and then superimpose the single map of each wafer to form a composite map 700 as shown in FIG. 7.

In the composite map 700, it may be seen that there are some dies with darker color in dotted line regions. Based on this, the user may know that the dies belonging to the specified bin numbers are more likely to fail at the positions corresponding to the dotted line regions, but the disclosure is not limited thereto.

In summary, in the embodiment of the disclosure, a corresponding general CP map be generated accordingly after obtaining the test data of the wafer. Since the general CP map may be simply stored in the server/database in a common image file format (for example, JPG), it uses less storage space temporarily compared to the conventional technique. Moreover, since the process of generating the general CP map of the wafer is relatively simple, it may also be completed under the condition of consuming less computing resources.

In addition, according to the embodiments of the disclosure, a single map and/or a bin-grouping map corresponding to a wafer may be generated through simple conversion according to user's needs. Accordingly, the efficiency of generating the single map and/or the bin-grouping map may be improved without occupying too much storage space.

Moreover, in the embodiment of the disclosure, after simply obtaining the single maps corresponding to the specified bin number for multiple wafers, these single maps may be superimposed to form a composite map corresponding to the specified bin number. Therefore, the efficiency of generating the composite map may also be improved.

It is apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A method for generating a chip probing wafer map, comprising:
    obtaining test data associated with a first wafer, wherein the first wafer comprises a plurality of sequentially arranged first dies, and each of the first dies belongs to one of a plurality of bin numbers;
    respectively assigning different predetermined color codes to the bin numbers; and
    generating a general chip probing wafer map for the first wafer by assigning a color code of each of the first dies as the corresponding predetermined color code according to a bin number to which each of the first dies belongs;
    converting the color code of each of the first dies in the general chip probing wafer map of the first wafer back to the corresponding bin number;
    obtaining at least one specified bin number in the bin numbers, and obtaining at least one specified color code corresponding to the at least one specified bin number;
    finding a plurality of first specified dies belonging to the at least one specified bin number in the first dies;
    finding a plurality of first other dies not belonging to the at least one specified bin number in the first dies; and
    replacing the color code of each of the first specified dies with the at least one specified color code, and replacing the color code of each of the first other dies with a reference color code, so as to convert the general chip probing wafer map of the first wafer into a first specified chip probing wafer map of the first wafer.

2. The method for generating the chip probing wafer map as claimed in claim 1, wherein the at least one specified bin number comprises a first specified bin number, the at least one specified color code is a first specified color code corresponding to the first specified bin number, and replacing the color code of each of the first specified dies with the at least one specified color code comprises:
    replacing the color code of each of the first specified dies with the first specified color code, wherein the first specified color code is different from the reference color code.

3. The method for generating the chip probing wafer map as claimed in claim 1, wherein the at least one specified bin number comprises a first specified bin number and a second specified bin number, the at least one specified color code comprises a first specified color code and a second specified color code, the first specified color code corresponds to the first specified bin number, the second specified color code corresponds to the second specified bin number, and replacing the predetermined color code of each of the first specified dies with the at least one specified color code comprises:
    replacing the color code of each of the first specified dies belonging to the first specified bin number with the first specified color code; and
    replacing the color code of each of the first specified dies belonging to the second specified bin number with the second specified color code, wherein the first specified color code, the second specified color code, and the reference color code are different from one another.

4. The method for generating the chip probing wafer map as claimed in claim 2, further comprising:
    obtaining a general chip probing wafer map of a second wafer, wherein the second wafer comprises a plurality of sequentially arranged second dies, each of the second dies belongs to one of the bin numbers, and a color code of each of the second dies corresponds to the predetermined color code of the bin number that belongs to the second dies;
    converting the color code of each of the second dies in the general chip probing wafer map of the second wafer back to the corresponding bin number;
    finding a plurality of second specified dies belonging to the first specified bin number from the second dies, and finding a plurality of second other dies not belonging to the first specified bin number from the second dies;
    replacing the color code of each of the second specified dies belonging to the first specified bin number with the first specified color code, and replacing the color code of each of the second other dies not belonging to the first specified bin number code with the reference color code, so as to convert the general chip probing wafer map of the second wafer to a first specified chip probing wafer map of the second wafer; and
    superimposing the first specified chip probing wafer map of the first wafer and the first specified chip probing wafer map of the second wafer to form a composite chip probing wafer map.

* * * * *